US009453278B2

(12) United States Patent
Nakano

(10) Patent No.: US 9,453,278 B2
(45) Date of Patent: Sep. 27, 2016

(54) DEPOSITION DEVICE AND DEPOSITION METHOD

(71) Applicant: LABOTEC LIMITED, Tokyo (JP)

(72) Inventor: Hirofumi Nakano, Chofu (JP)

(73) Assignee: Labotec Limited (JP)

( * ) Notice: Subject to any disclaimer, the term of this patent is extended or adjusted under 35 U.S.C. 154(b) by 0 days.

(21) Appl. No.: 14/403,084

(22) PCT Filed: May 21, 2013

(86) PCT No.: PCT/JP2013/064006
§ 371 (c)(1),
(2) Date: Nov. 21, 2014

(87) PCT Pub. No.: WO2014/013789
PCT Pub. Date: Jan. 23, 2014

(65) Prior Publication Data
US 2015/0118410 A1    Apr. 30, 2015

(30) Foreign Application Priority Data

Jul. 18, 2012  (JP) ................................ 2012-159347
Apr. 9, 2013   (JP) ................................ 2013-081042

(51) Int. Cl.
C23C 14/32      (2006.01)
C23C 14/06      (2006.01)
H01J 37/32      (2006.01)

(52) U.S. Cl.
CPC ........... *C23C 14/32* (2013.01); *C23C 14/0605* (2013.01); *H01J 37/32018* (2013.01); *H01J 37/32055* (2013.01); *H01J 37/32357* (2013.01); *H01J 37/32422* (2013.01); *H01J 37/32568* (2013.01); *H01J 37/32899* (2013.01)

(58) Field of Classification Search
USPC ............. 427/580, 248.1, 561, 569; 118/715, 118/722, 723 E; 250/492.21, 423, 398, 427
See application file for complete search history.

(56) References Cited

U.S. PATENT DOCUMENTS

| 5,313,067 A | * | 5/1994 | Houk | .................... C23C 14/221 250/398 |
| 5,565,036 A | | 10/1996 | Westendorp et al. | |
| 5,789,867 A | | 8/1998 | Westendorp et al. | |
| 6,169,288 B1 | * | 1/2001 | Horino | .................... H01J 37/08 250/423 P |

(Continued)

FOREIGN PATENT DOCUMENTS

| CN | 1711621 A | 12/2005 |
| CN | 1743124 A | 3/2006 |

(Continued)

OTHER PUBLICATIONS

Extended Search Report for European Patent Application No. 13819352.9, dated Feb. 5, 2015 (7 pages).

(Continued)

*Primary Examiner* — Phillip A Johnston
*Assistant Examiner* — Hsien Tsai
(74) *Attorney, Agent, or Firm* — Harness, Dickey & Pierce, P.L.C.

(57) ABSTRACT

A deposition device that deposits material particles includes an ionization section that ionizes the material particles utilizing a photoelectric effect in a reaction chamber to which the material particles are supplied, and an electrode section that guides the ionized material particles to a given area utilizing a Coulomb force.

11 Claims, 16 Drawing Sheets

(56) References Cited

U.S. PATENT DOCUMENTS

| | | | |
|---|---|---|---|
| 6,919,562 B1* | 7/2005 | Whitehouse et al. | 250/288 |
| 7,005,047 B2 | 2/2006 | Ishikura et al. | |
| 7,462,380 B2 | 12/2008 | Ishikura et al. | |
| 2002/0016079 A1 | 2/2002 | Dykstra et al. | |
| 2004/0110388 A1 | 6/2004 | Yan et al. | |
| 2004/0113100 A1* | 6/2004 | Keum | H01J 37/3171 250/492.21 |
| 2004/0168637 A1 | 9/2004 | Gorokhovsky | |
| 2006/0049034 A1 | 3/2006 | Lee et al. | |
| 2009/0008571 A1 | 1/2009 | Matsuura et al. | |
| 2009/0206270 A1* | 8/2009 | Glayish | H01J 37/05 250/396 ML |

FOREIGN PATENT DOCUMENTS

| | | |
|---|---|---|
| CN | 101457343 A | 6/2009 |
| JP | S62-205269 A | 9/1987 |
| JP | H03-166358 A | 7/1991 |
| JP | H04-176862 A | 6/1992 |
| JP | H07-278821 A | 10/1995 |
| JP | H08-288273 A | 11/1996 |
| JP | H09-256148 A | 9/1997 |
| JP | 2004-003006 A | 1/2004 |
| JP | 2006-193800 A | 7/2006 |
| JP | 2007-066796 A | 3/2007 |
| JP | 2008-270013 A | 11/2008 |
| JP | 2012-144751 A | 8/2012 |
| KR | 10-2008-0103959 | 11/2008 |
| WO | WO-2004-053922 A2 | 6/2004 |

OTHER PUBLICATIONS

International Search Report (in Japanese with English translation) for PCT/JP2013/064006, mailed Aug. 20, 2013; ISA/JP.

Office Action (in Japanese with English translation) regarding Japanese Application No. 2013-081042, dated Aug. 14, 2013.

* cited by examiner

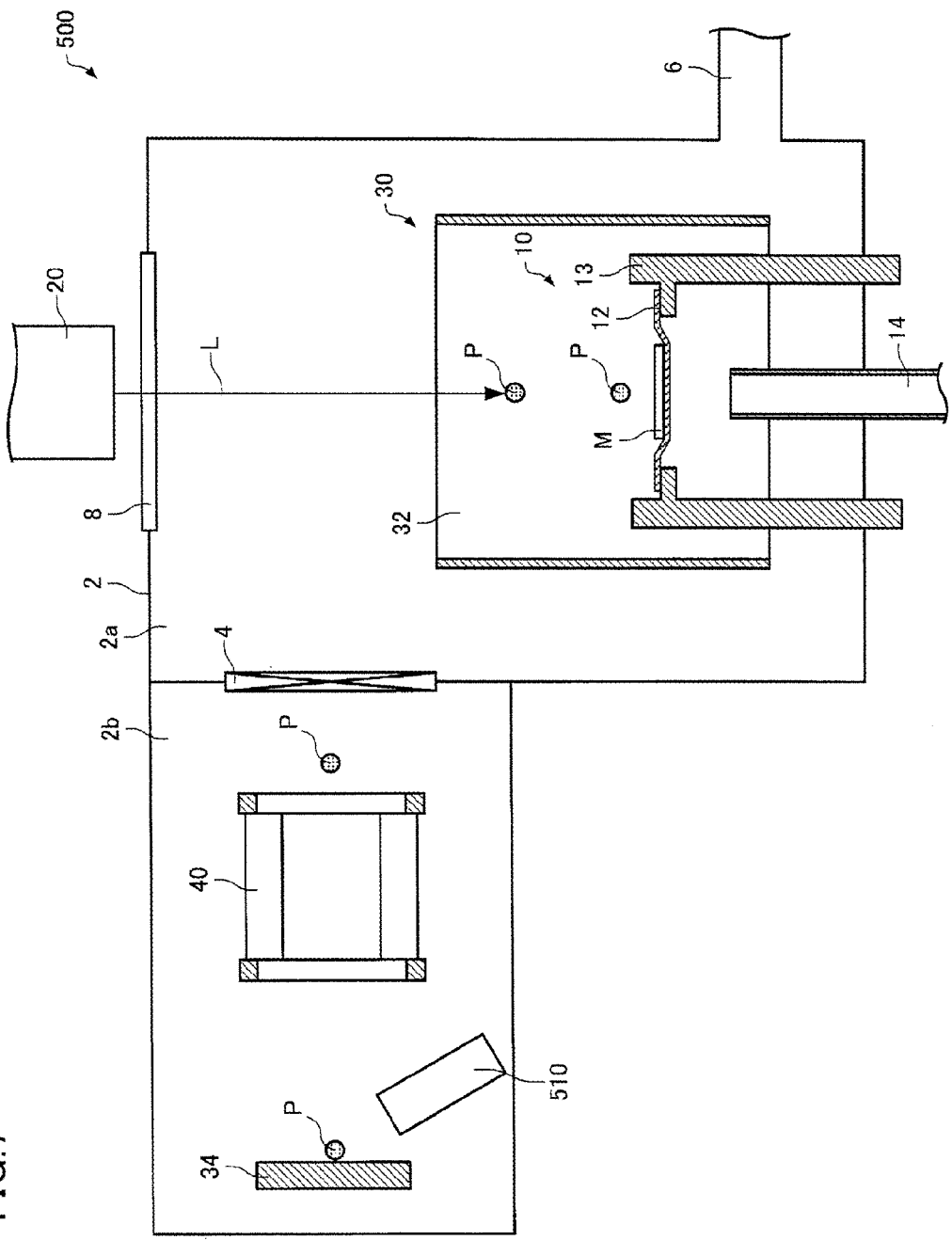

DEPOSITION DEVICE AND DEPOSITION METHOD

CROSS-REFERENCE TO RELATED APPLICATIONS

This application is a U.S. National Stage Application of International Application No. PCT/JP2013/064006 filed on May 21, 2013, and published in Japanese as WO 2014/013789 A1 on Jan. 23, 2014. This application claims priority to Japanese Application No. 2012-159347 filed on Jul. 18, 2012 and Japanese Application No. 2013-081042 filed on Apr. 9, 2013. The entire disclosures of the above applications are incorporated herein by reference.

TECHNICAL FIELD

The present invention relates to a deposition device and a deposition method.

BACKGROUND ART

A sputtering device, a vacuum deposition device, a chemical vapor deposition (CVD) device, and the like have been known as a deposition device that deposits a material on a substrate. An ion plating device has attracted attention as the deposition device since the ion plating device can form a film that exhibits good adhesion. For example, JP-A-9-256148 discloses an ion plating device that ionizes a vaporized material using electron beams emitted from a plasma electron gun, and deposits the ionized vaporized material (material particles) on a substrate.

SUMMARY OF THE INVENTION

Technical Problem

However, the deposition device disclosed in JP-A-9-256148 has a problem in that the particle size of the deposited material particles varies to a large extent, and it is difficult to control the particle size of the material particles to be deposited.

An object of several aspects of the invention is to provide a deposition device that makes it possible to control the particle size of the material particles to be deposited. Another object of several aspects of the invention is to provide a deposition method that makes it possible to control the particle size of the material particles to be deposited.

Solution to Problem (1) According to one aspect of the invention, a deposition device that deposits material particles includes:
an ionization section that ionizes the material particles utilizing a photoelectric effect in a reaction chamber to which the material particles are supplied; and
an electrode section that guides the ionized material particles to a given area utilizing a Coulomb force.

According to the deposition device, since the ionization section ionizes the material particles utilizing a photoelectric effect, the charge density in the ionized material particles per unit mass increases as the particle size of the material particles decreases. Therefore, the effect of the Coulomb force on the material particles increases as the particle size of the material particles decreases. The particle size of the material particles to be deposited can be controlled by causing the electrode section to apply a Coulomb force to the material particles ionized by the ionization section.

(2) In the deposition device, the ionization section may ionize the material particles by applying electromagnetic waves.

According to this configuration, the material particles can be ionized in a state in which the reaction chamber is maintained at a high degree of vacuum, for example.

(3) The deposition device may further include a material particle supply section that supplies the material particles to the reaction chamber.

(4) In the deposition device, the material particle supply section may include a first electrode and a second electrode, and cause an electric discharge to occur between the first electrode and the second electrode to supply the material particles.

(5) In the deposition device, the material particle supply section may vaporize a raw material by applying electromagnetic waves to supply the material particles.

(6) In the deposition device, the material particle supply section may supply fluid that includes the material particles.

(7) The deposition device may further include a temperature control section that controls the temperature of the material particles.

According to this configuration, when the particle size of the material particles changes depending on the temperature, for example, it is possible to control the particle size of the material particles supplied to the reaction chamber.

(8) The deposition device may further include a magnetic field generation section that generates a magnetic field in a travel path of the ionized material particles.

According to this configuration, it is possible to sort the ionized material particles corresponding to their magnetic properties.

(9) The deposition device may further include a mass filter section that sorts the ionized material particles corresponding to mass.

According to this configuration, it is possible to more advantageously control the particle size of the material particles to be deposited.

(10) The deposition device may further include a valve that is disposed between the reaction chamber and a sample chamber, the ionized material particles being deposited in the sample chamber.

According to this configuration, it is possible to control the amount of material particles to be deposited.

(11) In the deposition device the electrode section may include an electron trap electrode for trapping electrons released from the material particles due to the photoelectric effect, and a material particle trap electrode for trapping the ionized material particles.

(12) The deposition device may further include a neutralization section that supplies charged particles to the material particles deposited on the material particle trap electrode to neutralize the material particles deposited on the material particle trap electrode.

According to this configuration, it is possible to neutralize the material particles deposited on the material particle trap electrode.

(13) According to another aspect of the invention, a deposition method that deposits material particles includes:
supplying the material particles to a reaction chamber;
ionizing the material particles supplied to the reaction chamber utilizing a photoelectric effect; and
guiding the ionized material particles to a given area utilizing a Coulomb force to deposit the material particles.

According to the deposition method, since the material particles are ionized utilizing a photoelectric effect, the charge density in the ionized material particles per unit mass increases as the particle size of the material particles decreases. Therefore, the effect of the Coulomb force on the material particles increases as the particle size of the material particles decreases. The particle size of the material particles to be deposited can be controlled by applying a Coulomb force to the material particles ionized due to the photoelectric effect.

BRIEF DESCRIPTION OF DRAWINGS

FIG. 7 is a schematic view illustrating the configuration of a deposition device according to a fourth modification.

DESCRIPTION OF EMBODIMENTS

Exemplary embodiments of the invention are described in detail below with reference to the drawings. Note that the following exemplary embodiments do not unduly limit the scope of the invention as stated in the claims. Note also that all of the elements described in connection with the following exemplary embodiments should not necessarily be taken as essential elements of the invention.

1. Deposition Device

Figure 1:
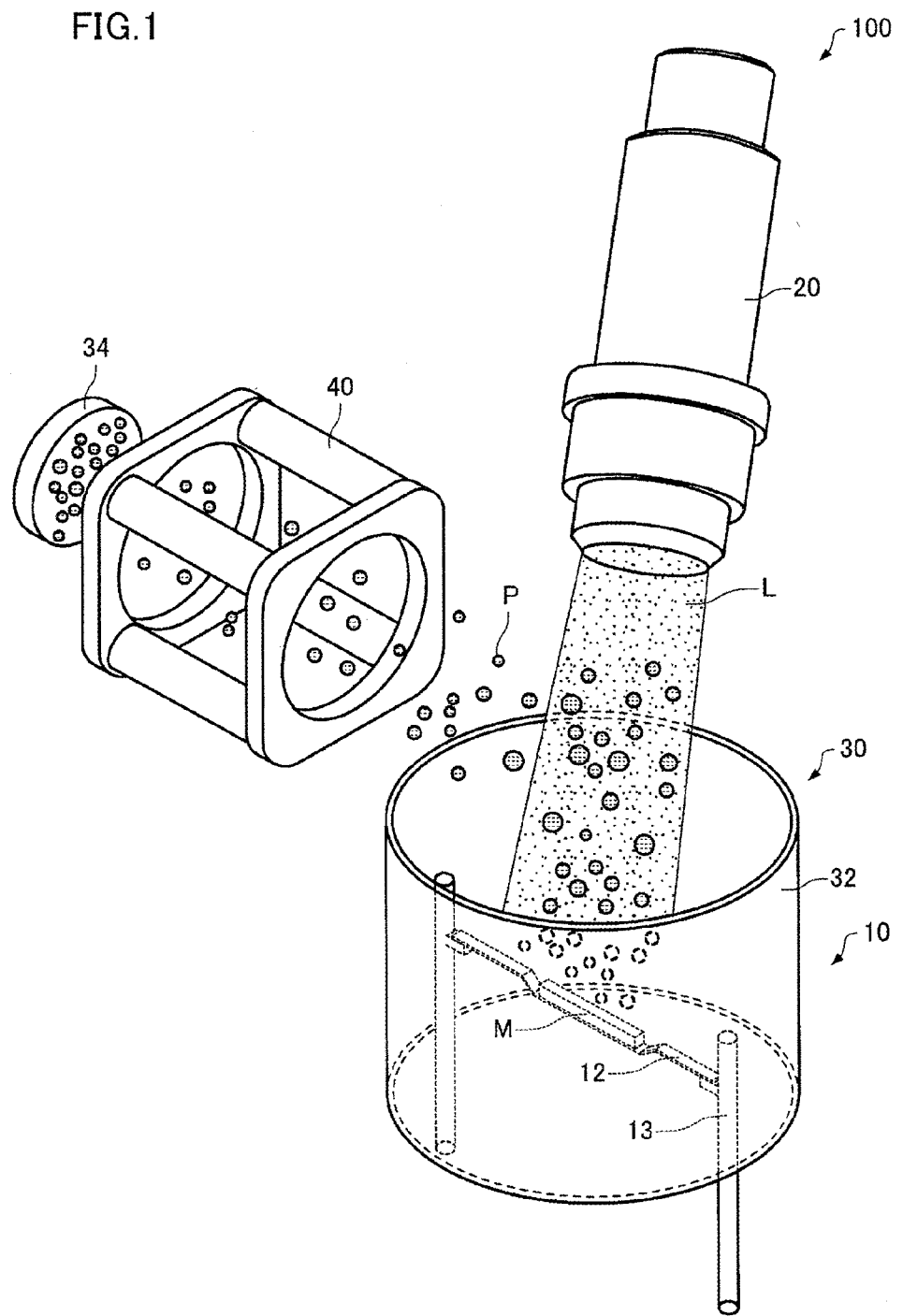
FIG. 1 is a perspective view schematically illustrating a deposition device according to one embodiment of the invention.
Figure 2:
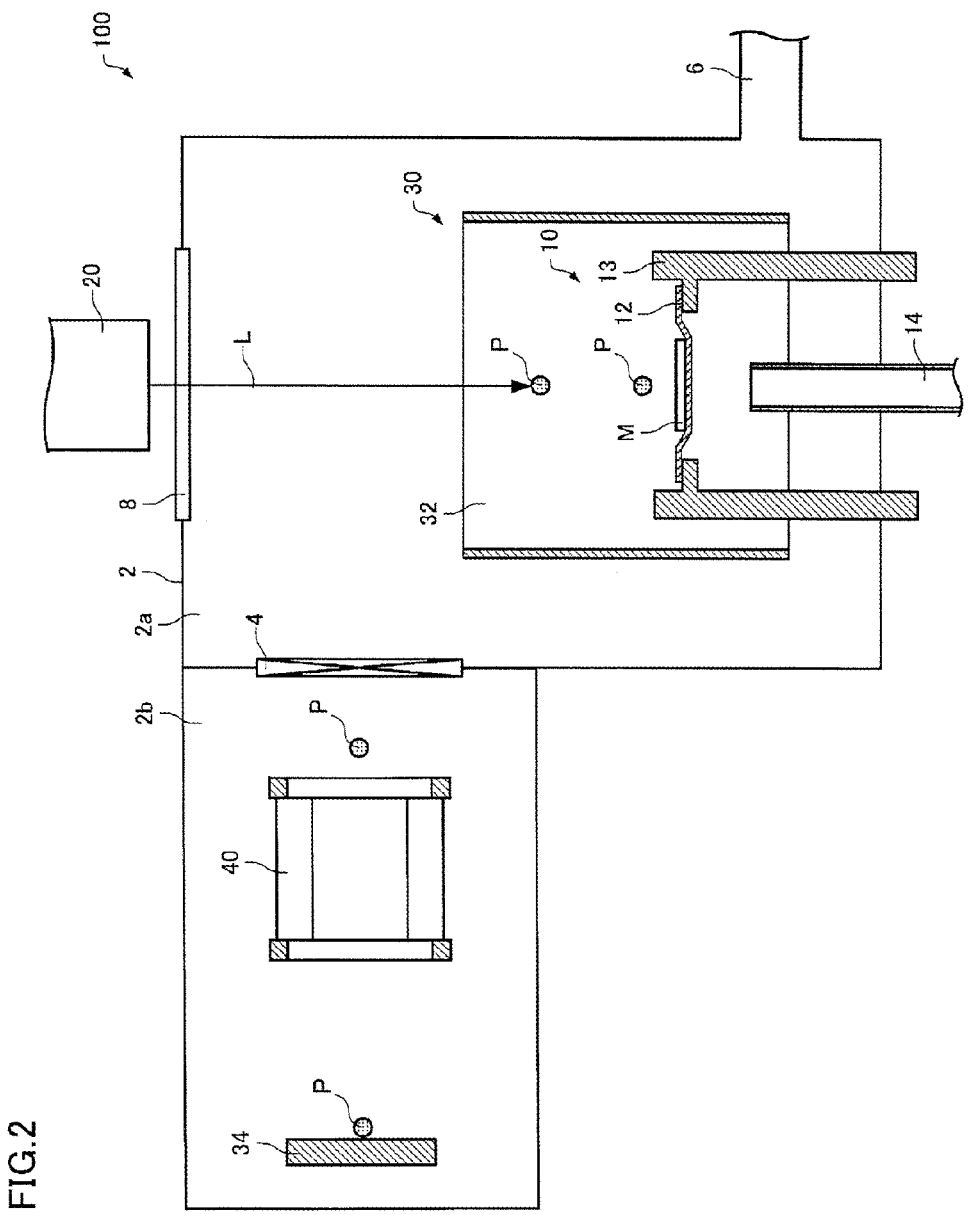
FIG. 2 is a schematic view illustrating the configuration of a deposition device according to one embodiment of the invention.

A deposition device according to one embodiment of the invention is described below with reference to the drawings. FIG. 1 is a perspective view schematically illustrating a deposition device 100 according to one embodiment of the invention. FIG. 2 is a schematic view illustrating the configuration of the deposition device 100 according to one embodiment of the invention. In FIG. 1, a chamber 2 and a temperature control section 14 are omitted for convenience of illustration.

As illustrated in FIGS. 1 and 2, the deposition device 100 includes an ionization section 20 and an electrode section 30. The deposition device 100 may further include the chamber 2, a material particle supply section 10, and a mass filter section 40.

The deposition device 100 is a device that deposits material particles P. Specifically, the deposition device 100 is configured so that the material particle supply section 10 supplies the material particles P to a reaction chamber 2a of the chamber 2, the ionization section 20 ionizes the material particles P supplied to the reaction chamber 2a utilizing a photoelectric effect, and the electrode section 30 guides the ionized material particles P to a material particle trap electrode 34 utilizing a Coulomb force to deposit the material particles P.

Examples of the material particles P include a carbon nanotube, a metal/semiconductor-embedded carbon nanotube, a fullerene, a metal, an insulator (e.g., ceramic), an organic material (e.g., protein, cell, or virus), toner, and aggregates thereof. When the material particles P are formed of a material that changes in physical/chemical properties due to electromagnetic waves (e.g., UV light) (e.g., protein, cell, or virus), an electromagnetic wave absorption material that absorbs electromagnetic waves may be incorporated in the material particles P. The shape of the material particles P is not particularly limited. For example, the material particles P may have a spherical shape, a polyhedral shape, a needle-like shape, or the like. The particle size of the material particles P is about several nanometers to several tens of micrometers, for example. When the material particles P do not have a spherical shape, the particle size of the material particles P refers to an equivalent volume diameter (i.e., the diameter of a sphere having the same volume as that of the material particle P).

The chamber 2 includes the reaction chamber 2a for ionizing the material particles P, and a sample chamber 2b in which the material particles P are deposited. A valve 4 that can be opened and closed is disposed between the reaction chamber 2a and the sample chamber 2b. The reaction chamber 2a and the sample chamber 2b communicate with each other when the valve 4 is opened. Although the chamber 2 is divided into the reaction chamber 2a and the sample chamber 2b in the example illustrated in the drawings, a single space may be formed inside the chamber 2. Specifically, the reaction chamber 2a and the sample chamber 2b may form a single space. The chamber 2 is evacuated by an evacuation device (not illustrated in the drawings) that is connected to an exhaust tube 6. The atmosphere inside the chamber 2 is a vacuum atmosphere, for example. The term "vacuum" used herein refers to a state in which the pressure is lower than atmospheric pressure. A shutter (not illustrated in the drawings) for controlling the amount (thickness) of the material particles P to be deposited on the material particle trap electrode 34 is provided in the chamber 2.

The material particle supply section 10 supplies the material particles P to the reaction chamber 2a. In the example illustrated in the drawings, the material particle supply section 10 includes a holding stage 12, and a support section 13 that supports the holding stage 12. The holding stage 12 is provided so that the holding stage 12 can hold a raw material M. The holding stage 12 is disposed inside a cylindrical electron trap electrode 32. The holding stage 12 is a resistive heating boat or the like. The material particle supply section 10 vaporizes the raw material M by heating (vacuum heating) the raw material M using the holding stage 12 to obtain the material particles P.

The material particle supply section 10 may vaporize the raw material M using an arbitrary method. For example, the material particle supply section 10 may vaporize the raw material M by applying electromagnetic waves (e.g., laser beam) to the raw material M placed on the holding stage 12 to obtain the material particles P (laser ablation). The raw material M can be vaporized while ionizing the material particles P by applying a UV laser beam. In this case, a common light source can be used as a light source of the material particle supply section 10 for vaporizing the raw material M and a light source of the ionization section 20 for ionizing the material particles P.

In the reaction chamber 2a, the temperature of the material particles P is controlled by the temperature control section 14. The temperature control section 14 can control the temperature of the material particles P. In the example illustrated in the drawings, the temperature control section 14 controls the temperature of the material particles P by supplying fluid to the reaction chamber 2a through a tube that communicates with the reaction chamber 2a. Examples of the fluid supplied by the temperature control section 14 include an inert gas such as helium and argon. For example, when the particle size of the material particles P changes depending on the temperature at which the material particles P are vaporized from the raw material M, the particle size of the material particles P supplied to the reaction chamber 2a can be controlled by controlling the temperature of the material particles P using the temperature control section 14.

The ionization section 20 ionizes the material particles P in the reaction chamber 2a utilizing a photoelectric effect. In the example illustrated in the drawings, the ionization section 20 ionizes the material particles P by applying electromagnetic waves L that have an energy higher than the work function of the material particles P. The ionization section 20 is a light source that generates the electromagnetic waves L. For example, the ionization section 20 is a UV lamp that applies UV light. The ionization section 20 may be a mercury lamp, a carbon-arc lamp, a xenon lamp, or the like.

The ionization section 20 is disposed outside the reaction chamber 2a. The ionization section 20 applies the electromagnetic waves L to the material particles P in the reaction chamber 2a through a window 8 provided to the chamber 2. The window 8 allows the electromagnetic waves L to pass through. The ionization section 20 may apply the electromagnetic waves L to the material particles P in the reaction chamber 2a through a lens or a mirror (not illustrated in the drawings).

When the ionization section 20 applies the electromagnetic waves L that have an energy higher than the work function of the material particles P to the material particles P, electrons inside the material particles P are excited, and released (photoelectric effect). The material particles P thus lose electrons (i.e., are cationized). The amount of charge held by the material particles P that have been ionized due to the photoelectric effect is proportional to the surface area of the material particles P. The mass of the material particles P is proportional to the volume of the material particles P. Therefore, the charge density in the material particles P per unit mass is inversely proportional to the radius of the material particles P (i.e., the particle size of the material particles P). Accordingly, the charge density in the material particles P per unit mass increases as the particle size of the material particles P decreases.

The amount of electrons released from the material particles P depends on the intensity of the electromagnetic waves L (i.e., the amount of electrons released from the material particles P increases as the intensity of the electromagnetic waves L increases). Therefore, the charge density in the material particles P per unit mass can be controlled by controlling the intensity of the electromagnetic waves L.

The configuration of the ionization section 20 is not particularly limited as long as the material particles P can be subjected to the photoelectric effect. For example, the ionization section 20 may be configured to introduce gas (e.g., Ar, Ne, or He) into the reaction chamber 2a, and generate electromagnetic waves (light) including UV light by applying a voltage between electrodes (not illustrated in the drawings) provided in the reaction chamber 2a (e.g., glow discharge) to subject the material particles P to the photoelectric effect.

The electrode section 30 guides the ionized material particles P to a given area utilizing a Coulomb force. The electrode section 30 includes the electron trap electrode 32 that is disposed in the reaction chamber 2a, and the material particle trap electrode 34 that is disposed in the sample chamber 2b.

In the example illustrated in the drawings, the electron trap electrode 32 is an anode. Therefore, the electron trap electrode 32 can trap electrons released from the material particles P due to the photoelectric effect. The electron trap electrode 32 produces a Coulomb force (repulsion) with respect to the cationized material particles P. The ionized material particles P are thus accelerated in the direction in which the material particles P move away from the electron trap electrode 32. The electron trap electrode 32 has a cylindrical shape, for example.

In the example illustrated in the drawings, the material particle trap electrode 34 is a cathode. Therefore, a Coulomb force (gravitation) occurs between the material particle trap electrode 34 and the material particles P, and the ionized material particles P are drawn toward the material particle trap electrode 34. The material particles P are thus deposited on the material particle trap electrode 34. For example, when a substrate (not illustrated in the drawings) is placed on the material particle trap electrode 34, the material particles P can be deposited on the substrate. The material particle trap electrode 34 has a plate-like shape, for example. In the example illustrated in the drawings, the material particle trap electrode 34 has a disc-like shape.

As described above, the charge density in the material particles P (that have been ionized due to the photoelectric effect) per unit mass increases as the particle size of the material particles P decreases. Therefore, the effect of the Coulomb force on the material particles P increases as the particle size of the material particles P decreases. Specifically, the ionized material particles P are more easily accelerated by the electron trap electrode 32, and drawn toward the material particle trap electrode 34 as the particle size of the material particles P decreases. Therefore, the particle size of the material particles P to be deposited can be controlled by controlling the voltage applied to the electrode section 30. For example, the upper limit of the particle size of the material particles P to be deposited can be increased by increasing the voltage applied between the electrodes 32 and 34, and can be decreased by decreasing the voltage applied between the electrodes 32 and 34.

Although an example in which the electrode section 30 includes the electrodes 32 and 34 has been described above, the number of electrodes included in the electrode section 30 is not particularly limited. The electrode section 30 may include only one electrode, or may include three or more electrodes. For example, not illustrated in the drawings, but the electrode section 30 may include only the electron trap electrode 32, or may include only the material particle trap electrode 34.

The mass filter section 40 is disposed in a path in which the ionized material particles P travel toward the material particle trap electrode 34. In the example illustrated in the drawings, the mass filter section 40 is disposed in the sample chamber 2b. The mass filter section 40 sorts the ionized material particles P corresponding to the mass of the material particles P. Specifically, the mass filter section 40 allows the material particles P having a mass within a given mass range to pass through, and changes the travel direction of the material particles P having a mass outside the given mass range so that the material particles P do not travel toward the material particle trap electrode 34. The mass filter section 40 is a quadrupole mass filter that includes four cylindrical electrodes, for example. Note that the deposition device 100 may not include the mass filter section 40, and may be configured so that the ionized material particles P are deposited directly on the material particle trap electrode 34.

Not illustrated in the drawings, but the deposition device 100 may include a gas supply section that supplies gas to the reaction chamber 2a. The gas supply section can assist ionization of the material particles P, and control the amount of charge held by the material particles P by supplying an ionized or charged gas to the reaction chamber 2a. Note that the temperature control section 14 may function as the gas supply section.

Figure 3:
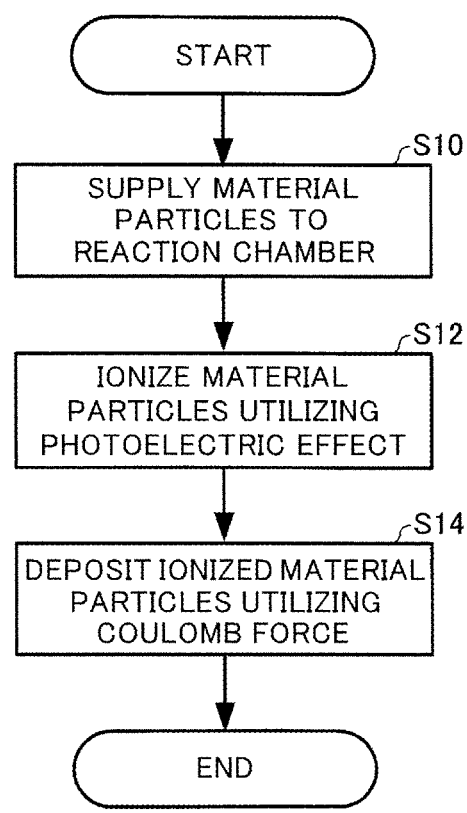
FIG. 3 is a flowchart illustrating an example of a material particle deposition method according to one embodiment of the invention.

A material particle deposition method that utilizes the deposition device 100 according to one embodiment of the invention is described below. FIG. 3 is a flowchart illustrating an example of a material particle deposition method according to one embodiment of the invention. The material particle deposition method according to one embodiment of the invention includes a step S10 that supplies the material particles P to the reaction chamber 2a, a step S12 that ionizes the material particles P supplied to the reaction chamber 2a utilizing the photoelectric effect, and a step S13 that guides the ionized material particles P to a given area utilizing a Coulomb force to deposit the material particles P.

Specifically, the material particle supply section 10 supplies the material particles P to the reaction chamber 2a (S10). The material particle supply section 10 vaporizes the raw material M by vacuum heating, or applying electromagnetic waves (laser beam) to supply the material particles P to the reaction chamber 2a. In this case, the temperature control section 14 controls the temperature of the material particles P to control the particle size of the material particles P. The chamber 2 is evacuated through the exhaust tube 6.

The ionization section 20 ionizes the material particles P supplied to the reaction chamber 2a utilizing the photoelectric effect (S12). The ionization section 20 ionizes the material particles P supplied to the reaction chamber 2a by applying the electromagnetic waves L to the material particles P. Electrons released from the material particles P due to the photoelectric effect are trapped by the electron trap electrode 32.

The electrode section 30 guides the ionized material particles P to the material particle trap electrode 34 utilizing a Coulomb force to deposit the material particles P (S14). The electrode section 30 applies a Coulomb force to the ionized material particles P using the electron trap electrode 32 and the material particle trap electrode 34 to guide the material particles P to the material particle trap electrode 34. The material particles P are thus deposited on the material particle trap electrode 34. The charge density in the material particles P (that have been ionized due to the photoelectric effect) per unit mass increases as the particle size of the material particles P decreases, and the particle size of the material particles P to be deposited can be controlled by controlling the intensity of the electromagnetic waves L or the voltage applied to the electrode section 30, for example. The mass filter section 40 is disposed in the travel path of the ionized material particles P. The mass filter section 40 allows the material particles P having a mass within a given mass range to pass through, and changes the travel direction of the material particles P having a mass outside the given mass range so that the material particles P are not deposited on the material particle trap electrode 34. This makes it possible to more advantageously control the particle size of the material particles P to be deposited. The amount of material particles P to be deposited can be controlled by opening and closing the valve 4.

The material particles P can be deposited by the above steps.

The deposition device 100 according to one embodiment of the invention and the deposition method according to one embodiment of the invention have the following features, for example.

The deposition device 100 is configured so that the ionization section 20 ionizes the material particles P utilizing the photoelectric effect, and the electrode section 30 guides the ionized material particles P to a given area (material particle trap electrode 34) utilizing a Coulomb force to control the particle size of the material particles P to be deposited. Since the ionized material particles P are accelerated by a Coulomb force, and then deposited, the deposited material particles P exhibit high adhesion to the deposition target (material particle trap electrode 34 or substrate). This makes it possible to prevent aggregation of the material particles P due to a van der Waals force or the like. Therefore, it is possible to prevent a situation in which the material particles P aggregate on the deposition target to form large particles.

Since the deposition device 100 can control the particle size of the material particles P to be deposited, a film of the material particles P having a uniform particle size can be obtained. It is also possible to selectively obtain the material particles P having the desired particle size from a sample in which the material particles P that differ in particle size are mixed.

The deposition device 100 is configured so that the ionization section 20 can ionize the material particles P by applying the electromagnetic waves L to the material particles P. Therefore, the material particles P can be ionized in a state in which the inside of the chamber 2 is maintained at a high degree of vacuum. For example, when the material particles P are ionized by utilizing gas plasma, the degree of vacuum inside the chamber decreases since gas for generating plasma is required, and impurities may adhere to the deposition target. Since the deposition device 100 is configured to ionize the material particles P by applying the electromagnetic waves L to the material particles P, the above problem does not occur.

The deposition device 100 is configured so that the material particle supply section 10 vaporizes the raw material M by applying the electromagnetic waves L to supply the material particles P. The raw material M can be vaporized while ionizing the material particles P by applying the electromagnetic waves L. Specifically, a common light source can be used as a light source of the material particle supply section 10 for vaporizing the raw material M and a light source of the ionization section 20 for ionizing the material particles P. This makes it possible to simplify the configuration of the deposition device 100.

The deposition device 100 includes the temperature control section 14 that controls the temperature of the material particles P. For example, when the particle size of the material particles P changes depending on the temperature at which the material particles P are vaporized from the raw material M, the particle size of the material particles P supplied to the reaction chamber 2a can be controlled by controlling the temperature of the material particles P using the temperature control section 14. This makes it possible to more advantageously control the particle size of the material particles P to be deposited.

Since the deposition device 100 is configured so that the mass filter section 40 can sort the ionized material particles P corresponding to the mass of the material particles P, it is possible to more advantageously control the particle size of the material particles P to be deposited.

Since the deposition device 100 includes the valve 4 that is disposed between the reaction chamber 2a and the sample chamber 2b in which the ionized material particles P are deposited, it is possible to control the amount (thickness) of material particles P to be deposited on the material particle trap electrode 34.

The deposition device 100 is configured so that the electrode section 30 includes the electron trap electrode 32 for trapping electrons released from the material particles P due to the photoelectric effect, and the material particle trap electrode 34 for trapping the ionized material particles P. This makes it possible to efficiently guide the material particles P to the material particle trap electrode 34.

The deposition method according to one embodiment of the invention includes the step that supplies the material particles P to the reaction chamber 2a, the step that ionizes the material particles P supplied to the reaction chamber 2a utilizing the photoelectric effect, and the step that guides the ionized material particles P to a given area utilizing a Coulomb force to deposit the material particles P. This makes it possible to control the particle size of the material particles P to be deposited. Since the ionized material particles P are deposited utilizing a Coulomb force, aggregation of the material particles P can be prevented.

2. Modifications

Deposition devices according to several modifications are described below. Note that a member having the same function as that of each member of the deposition device 100 is indicated by the same reference sign, and detailed description thereof is omitted.

(1) First Modification

Figure 4:
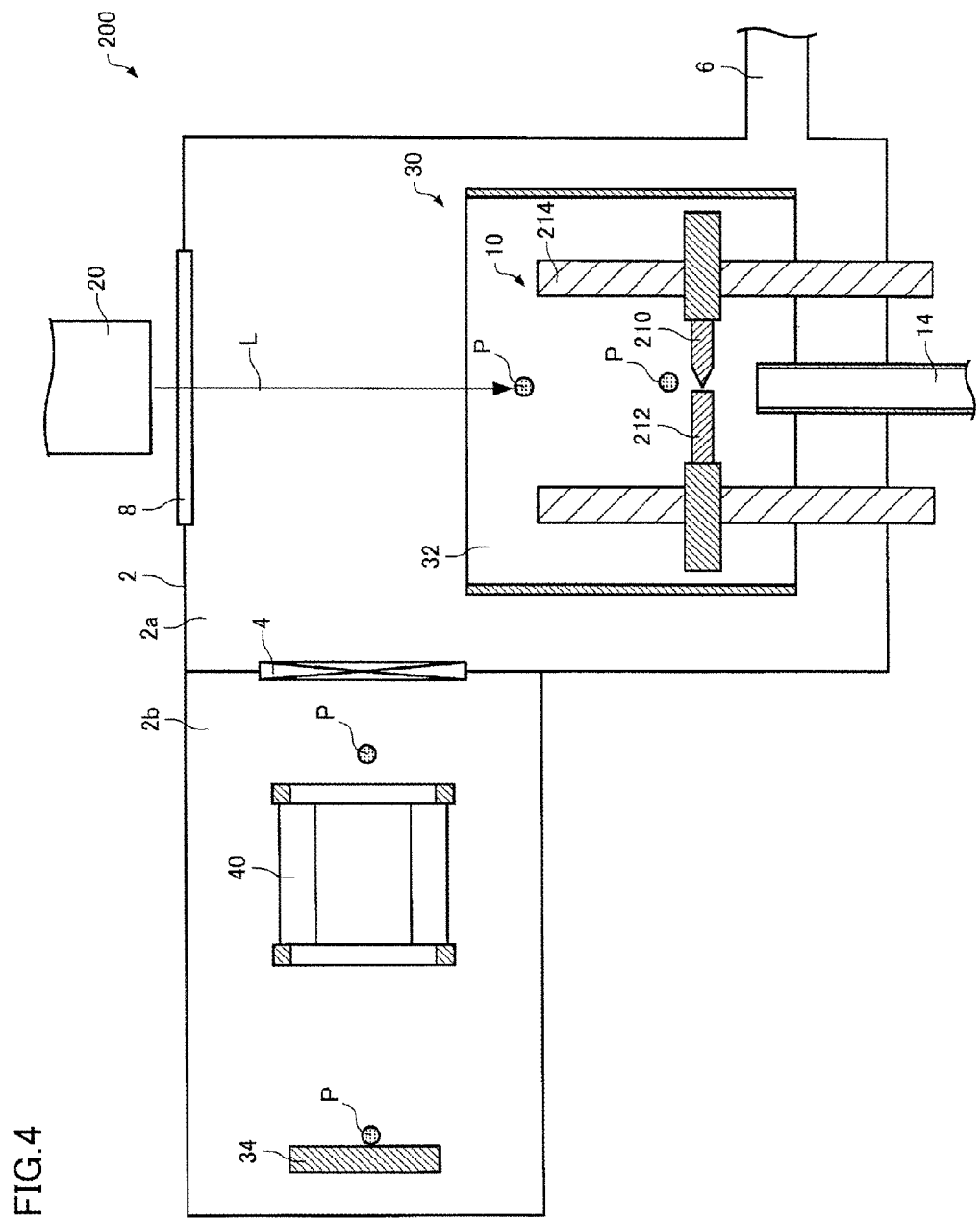
FIG. 4 is a schematic view illustrating the configuration of a deposition device according to a first modification.

A deposition device according to a first modification is described below with reference to the drawings. FIG. 4 is a schematic view illustrating the configuration of a deposition device 200 according to the first modification.

The deposition device 100 is configured so that the material particle supply section 10 vaporizes the raw material M by vacuum heating, or applying electromagnetic waves (laser beam) to supply the material particles P to the reaction chamber 2a (see FIGS. 1 and 2).

The deposition device 200 is configured so that the material particle supply section 10 causes an electric discharge to occur between a first electrode 210 and a second electrode 212 to supply the material particles P to the reaction chamber 2a (see FIG. 4). Examples of the electric discharge that is caused to occur between the first electrode 210 and the second electrode 212 include a glow discharge, an arc discharge, and the like.

The material particle supply section 10 includes the first electrode 210, the second electrode 212, and a support section 214.

The first electrode 210 and the second electrode 212 are respectively supported by the support section 214. The first electrode 210 and the second electrode 212 are disposed inside the cylindrical electron trap electrode 32. The first electrode 210 and the second electrode 212 are connected to a power supply (not illustrated in the drawings). A voltage is applied between the first electrode 210 and the second electrode 212 from the power supply so that an electric discharge occurs. The material particle supply section 10 is configured so that the material particles P are released from the surface of at least one of the first electrode 210 and the second electrode 212 by causing an electric discharge to occur between the first electrode 210 and the second electrode 212. For example, when at least one of the first electrode 210 and the second electrode 212 is formed of a carbon-containing material, carbon nanotubes, fullerenes, or aggregates thereof can be supplied as the material particles P. When at least one of the first electrode 210 and the second electrode 212 is formed of a metal, metal particles can be supplied as the material particles P.

(2) Second Modification

Figure 5:
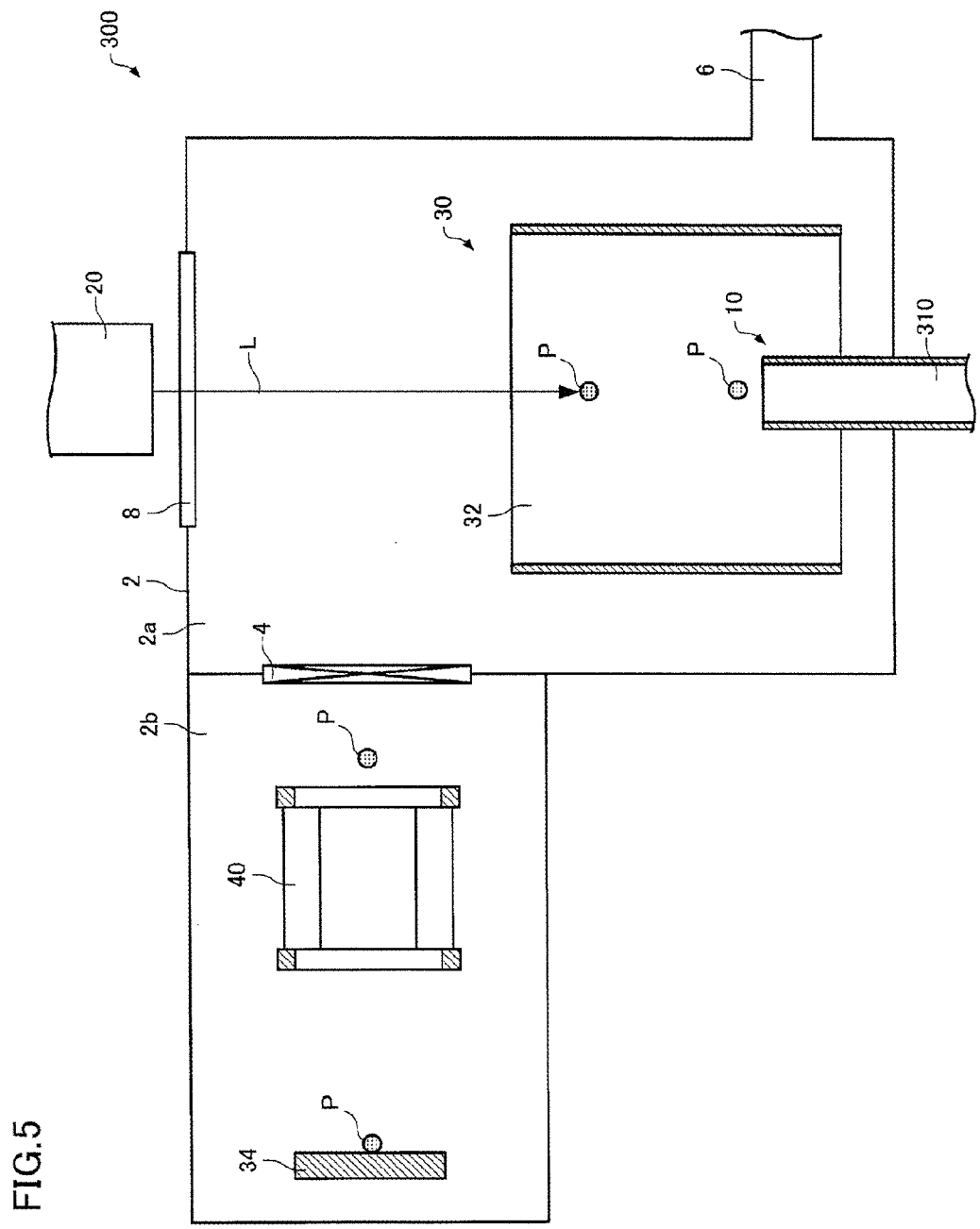
FIG. 5 is a schematic view illustrating the configuration of a deposition device according to a second modification.

A deposition device according to a second modification is described below with reference to the drawings. FIG. 5 is a schematic view illustrating the configuration of a deposition device 300 according to the second modification.

The deposition device 100 is configured so that the material particle supply section 10 vaporizes the raw material M by vacuum heating, or applying electromagnetic waves (laser beam) to supply the material particles P to the reaction chamber 2a (see FIGS. 1 and 2).

The deposition device 300 is configured so that the material particle supply section 10 supplies fluid that includes the material particles P to the reaction chamber 2a (see FIG. 5).

The deposition device 300 is configured so that the material particle supply section 10 includes a material particle supply tube 310 that communicates with the reaction chamber 2a. The material particle supply tube 310 connects the reaction chamber 2a and a container (not illustrated in the drawings) that contains the fluid that includes the material particles P. An inert gas may be used as the fluid, for example. The material particle supply section 10 supplies the fluid that includes the material particles P and is contained in the container to the reaction chamber 2a through the material particle supply tube 310.

(3) Third Modification

Figure 6:
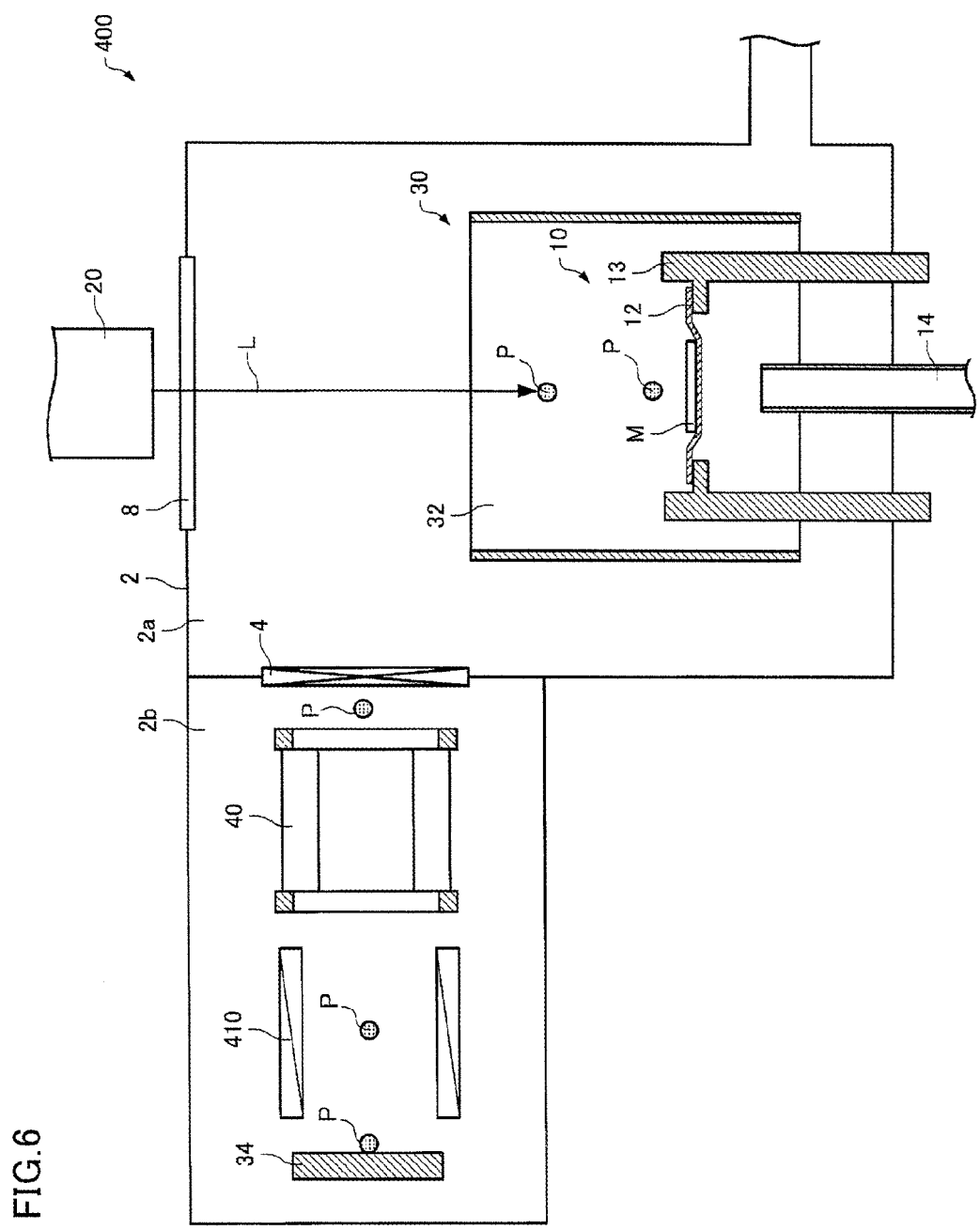
FIG. 6 is a schematic view illustrating the configuration of a deposition device according to a third modification.

A deposition device according to a third modification is described below with reference to the drawings. FIG. 6 is a schematic view illustrating the configuration of a deposition device 400 according to the third modification.

As illustrated in FIG. 6, the deposition device 400 includes a magnetic field generation section 410 that generates a magnetic field in the travel path of the ionized material particles P.

In the example illustrated in the drawings, the magnetic field generation section 410 is disposed in the sample chamber 2b. More specifically, the magnetic field generation section 410 is disposed between the mass filter section 40 and the material particle trap electrode 34. Note that the magnetic field generation section 410 may be disposed at an arbitrary position as long as the magnetic field generation section 410 can generate a magnetic field in the travel path of the ionized material particles P. The magnetic field generation section 410 may generate a static magnetic field, or may generate an alternating magnetic field. The material particles P can be sorted corresponding to their magnetic properties by causing the magnetic field generation section 410 to generate a magnetic field in the travel path of the ionized material particles P. Therefore, when the material particles P include a magnetic material and a non-magnetic material, only the magnetic material or only the non-magnetic material can be deposited. For example, the deposition device 400 can sort out a magnetic material (magnetic toner) or a non-magnetic material (non-magnetic toner) from a toner material that includes a magnetic material and a non-magnetic material.

Although the deposition device 400 includes the mass filter section 40 and the magnetic field generation section 410 in the example illustrated in the drawings, the magnetic field generation section 410 may be provided instead of the mass filter section 40.

(4) Fourth Modification

A deposition device according to a fourth modification is described below with reference to the drawings. FIG. 7 is a schematic view illustrating the configuration of a deposition device 500 according to the fourth modification.

As illustrated in FIG. 7, the deposition device 500 includes a neutralization section 510 that supplies charged particles (e.g., electrons or ions) to the material particles P deposited on the material particle trap electrode 34 to neutralize the material particles P.

For example, the neutralization section 510 is provided in the sample chamber 2b. For example, the neutralization section 510 generates electron beams or ion beams, and emits the electron beams or the ion beams toward the material particles P deposited on the material particle trap electrode 34. The neutralization section 510 is an electron gun, an ion gun, or the like.

The neutralization section 510 may supply an ionized fluid to the material particles P deposited on the material particle trap electrode 34 to neutralize the material particles P. For example, an ionized fluid may be supplied from the temperature control section 14. In this case, an ionizer or the like may be used as the neutralization section 510.

Since the deposition device 500 includes the neutralization section 510, the material particles P deposited on the material particle trap electrode 34 can be neutralized. For example, when the material particles P are formed of an insulator, the surface of the material particle trap electrode 34 may be apparently set at the same potential as that of the electron trap electrode 32 when the charged material particles P are deposited on the material particle trap electrode 34. In this case, the electric field between the electron trap electrode 32 and the material particle trap electrode 34 disappears, and the material particles P may not be deposited on the material particle trap electrode 34 even if the material particles P are charged due to the photoelectric effect. Since the deposition device 500 can neutralize the material particles P deposited on the material particle trap electrode 34, such a problem does not occur.

When using the deposition device 500, the material particles P are deposited on the material particle trap electrode 34 by performing the step S10, the step S12, and the step S14 illustrated in FIG. 3, and the charged particles are supplied to the material particles P deposited on the material particle trap electrode 34 from the neutralization section 510 to neutralize the charged material particles P deposited on the material particle trap electrode 34, for example. The step S10, the step S12, and the step S14 are performed again to further deposit the material particles P on the material particle trap electrode 34. The material particles P can be continuously deposited on the material particle trap electrode 34 by repeatedly depositing and neutralizing the material particles P.

Note that the above embodiments and the modifications are merely examples, and the invention is not limited to the above embodiments and the modifications.

Although an example in which the material particles P are cationized has been described above, the material particles P may be anionized. For example, the material particles P and additional particles are supplied to the reaction chamber 2a, and electromagnetic waves that have an energy higher than the work function of the additional particles are applied to the material particles P and the additional particles. Therefore, electrons are released from the additional particles due to the photoelectric effect. The material particles P capture the released electrons, and are anionized. When the material particles P are anionized, the electrode 32 serves as a cathode, and the electrode 34 serves as an anode.

Although an example in which the atmosphere inside the chamber 2 is a vacuum atmosphere has been described above, the atmosphere inside the chamber 2 is not particularly limited as long as the material particles P can be ionized due to the photoelectric effect. For example, the atmosphere inside the chamber 2 may be an air atmosphere, or may be a liquid atmosphere. For example, the atmosphere inside the chamber 2 may be set to a liquid atmosphere by filling the chamber 2 with fluorine oil, silicone oil, or the like.

The above embodiments and the modifications may be appropriately combined.

3. Examples

The invention is further described below by way of examples. Note that the invention is not limited to the following examples.

3.1. Preparation of Sample

The following experiments were performed using the deposition device 200 illustrated in FIG. 4.

The material particle trap electrode 34 was made of stainless steel, and had an end effective diameter of about 20 mm, and a voltage of −500 V was applied to the material particle trap electrode 34. A silicon wafer (about 10×10 mm) was secured on the material particle trap electrode 34 using a carbon tape, and the material particles P deposited on the silicon wafer were observed as a sample. The material particle supply section 10 was designed to be an arc discharge material particle supply section using a carbon electrode. Specifically, the material particles P were carbon particles.

The electron trap electrode 32 was made of stainless steel, and a voltage of +1000 V was applied to the electron trap electrode 32. A deuterium lamp (manufactured by Hamamatsu Photonics K.K.) was used as the ionization section 20, and UV light was applied to the material particles P. A high-vacuum seal-type valve (manufactured by VAT Ltd.) was used as the valve 4. He gas (several sccm) was supplied from the temperature control section 14 using a mass flow controller (manufactured by HORIBA STEC Co., Ltd.).

After evacuating the reaction chamber 2a and the sample chamber 2b to $5×10^{-4}$ Pa using a turbo-molecular pump, an arc discharge was caused to occur under the above conditions using the electrodes 210 and 212, and vaporized carbon was deposited on the silicon wafer secured on the material particle trap electrode 34 to prepare a sample (hereinafter referred to as "example sample").

As a comparative example, carbon was deposited on a silicon wafer using an arc discharge deposition device that was not provided with the ionization section 20 and the electrode section 30, or an arc flash discharge deposition device that was not provided with the ionization section 20 and the electrode section 30, to prepare a sample (hereinafter referred to as "comparative sample"). The arc flash discharge deposition device was configured to cause an arc discharge to occur by applying a pulsed voltage to deposit carbon (arc flash method).

3.2. Experiments

The example sample was observed using a scanning electron microscope ("JSM-7001F" manufactured by JEOL Ltd.) and a transmission electron microscope ("JEM-2100" manufactured by JEOL Ltd.).

The comparative sample was observed using a scanning electron microscope ("JSM-7001F" manufactured by JEOL Ltd.).

3.3. Results

Figure 8A:
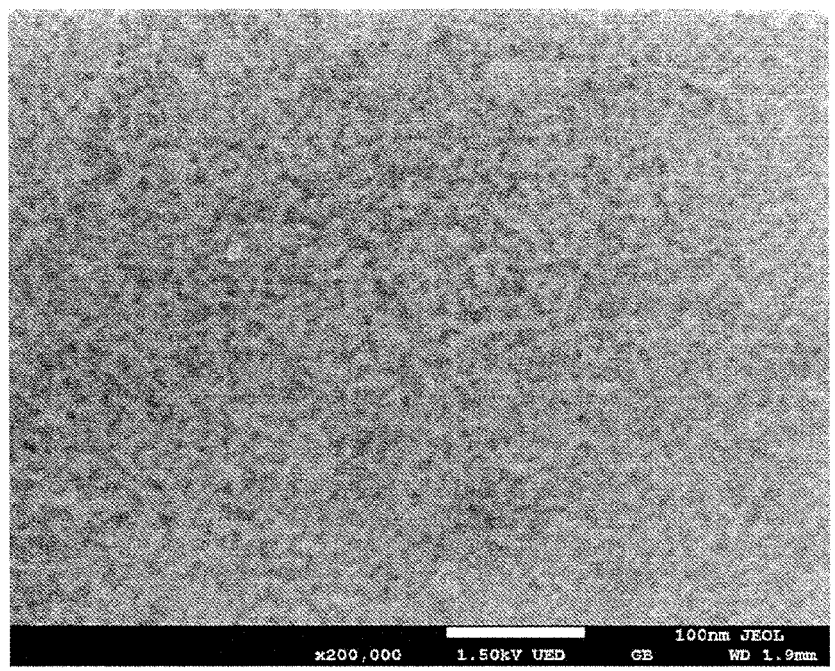
FIG. 8A illustrates an SEM photograph of the example sample observed using a scanning electron microscope.
Figure 8B:
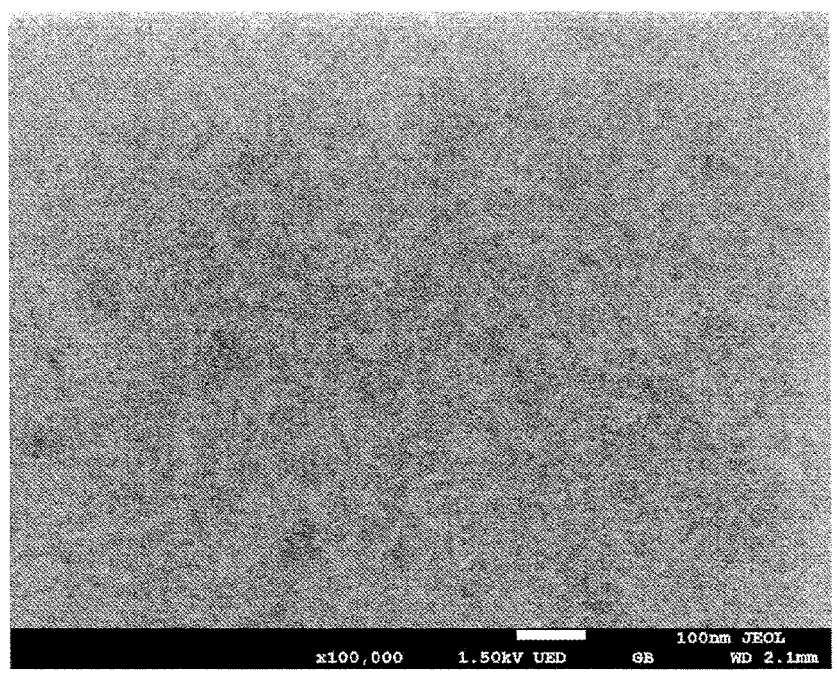
FIG. 8B illustrates an SEM photograph of the example sample observed using a scanning electron microscope.

FIGS. 8A and 8B illustrate SEM photographs of the example sample observed using the scanning electron microscope "JSM-7001F". FIG. 8A illustrates the SEM photograph observed at a magnification of 200,000 and an accelerating voltage of 1.5 kV. FIG. 8B illustrates the SEM photograph observed at a magnification of 100,000 and an accelerating voltage of 1.5 kV.

FIGS. 9A to 12B illustrate TEM photographs of the example sample observed using the transmission electron microscope "JEM-2100". FIGS. 9A to 12B differ in field of view. FIG. 9B illustrates an enlarged TEM photograph of part of the image illustrated in FIG. 9A. This also applies to FIGS. 10A to 12B.

FIGS. 13A to 13D illustrate SEM photographs of the comparative sample prepared using the arc discharge deposition device (observed using the scanning electron microscope "JSM-7001F"). FIGS. 14A to 14D illustrate SEM photographs of the comparative sample prepared using the arc flash discharge deposition device (observed using the scanning electron microscope "JSM-7001F").

As illustrated in FIGS. 8A and 8B, a clear image could not be obtained when observing the example sample using the scanning electron microscope (some particles considered to be carbon particles were observed). This is considered to be because the resolution of the scanning electron microscope was insufficient to observe the carbon particles having a small diameter.

As illustrated in FIGS. 9A to 12B, carbon particles having a diameter of about 3 to 30 nm were dispersed in the example sample at intervals of about 10 to 100 nm.

It is normally difficult for nanometer-sized fine particles to present independently due to a strong cohesive force. However, since the deposition device 200 is configured so that the electrode section 30 ensures that the fine particles (carbon particles) are accelerated and deposited on the silicon wafer, and the fine particles (carbon particles) are ionized to have the same polarity, the fine particles (carbon particles) are deposited on the silicon wafer while undergoing repulsion. It is considered that the fine particles (carbon particles) were thus deposited on the silicon wafer without undergoing aggregation (while maintaining a certain distance) (see FIGS. 9A to 12B).

As illustrated in FIGS. 8A and 8B, the example sample could be observed using the scanning electron microscope without occurrence of a charging phenomenon. Since a charging phenomenon did not occur even though the carbon particles were dispersed at a certain distance, it is considered that the carbon particles were electrically connected due to a tunneling effect.

These results were achieved by preventing a situation in which the carbon particles aggregate due to a van der Waals force or the like, and uniformly producing the carbon particle.

Figure 9A:
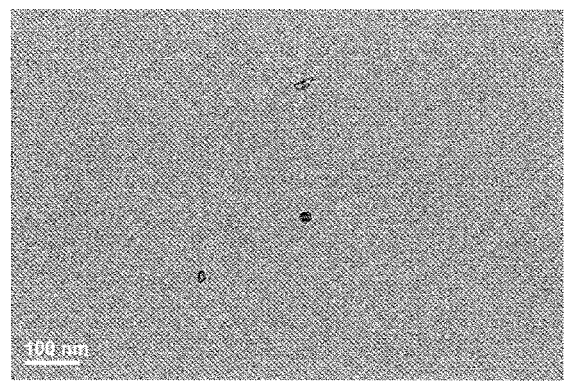
FIG. 9A illustrates a TEM photograph of the example sample observed using a transmission electron microscope.
Figure 9B:
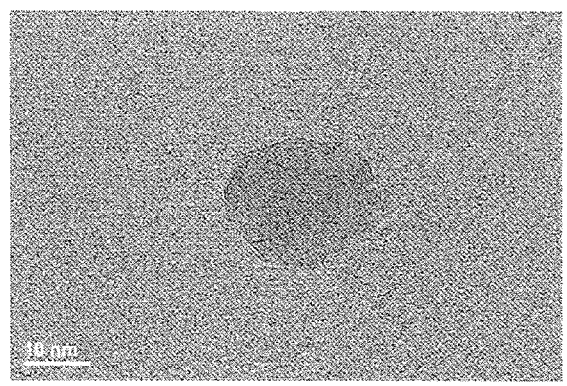
FIG. 9B illustrates an enlarged TEM photograph of part of the image illustrated in FIG. 9A.
Figure 10A:
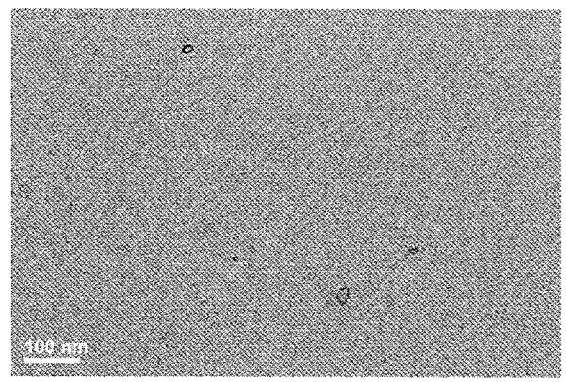
FIG. 10A illustrates a TEM photograph of the example sample observed using a transmission electron microscope.
Figure 10B:
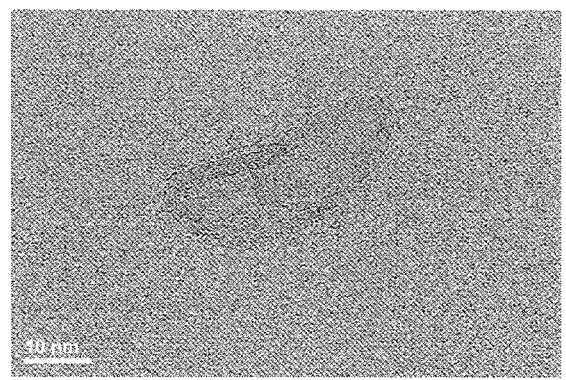
FIG. 10B illustrates an enlarged TEM photograph of part of the image illustrated in FIG. 10A.
Figure 11A:
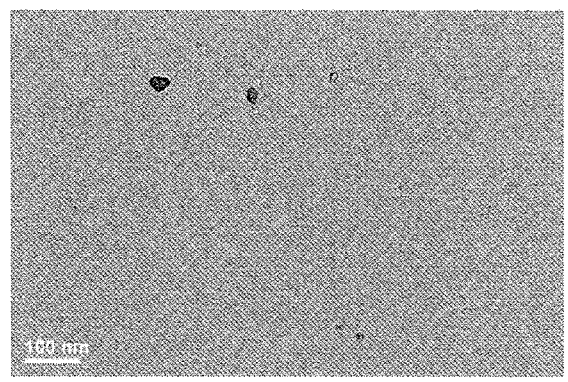
FIG. 11A illustrates a TEM photograph of the example sample observed using a transmission electron microscope.
Figure 11B:
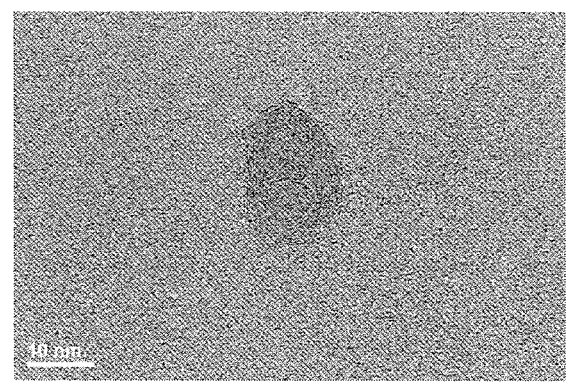
FIG. 11B illustrates an enlarged TEM photograph of part of the image illustrated in FIG. 11A.
Figure 12A:
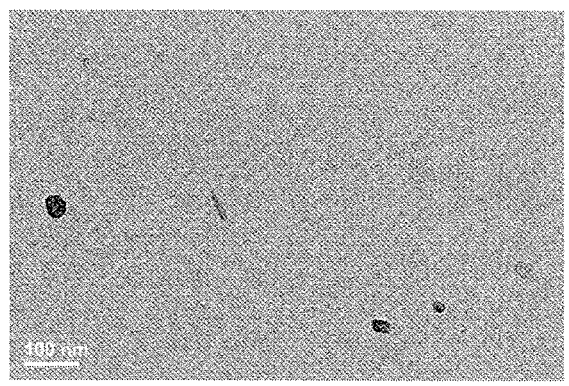
FIG. 12A illustrates a TEM photograph of the example sample observed using a transmission electron microscope.
Figure 12B:
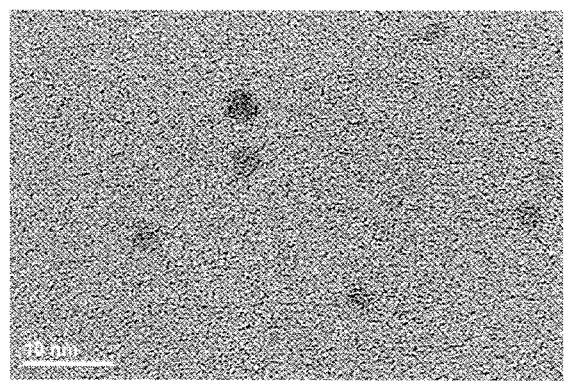
FIG. 12B illustrates an enlarged TEM photograph of part of the image illustrated in FIG. 12A.
Figure 13A:
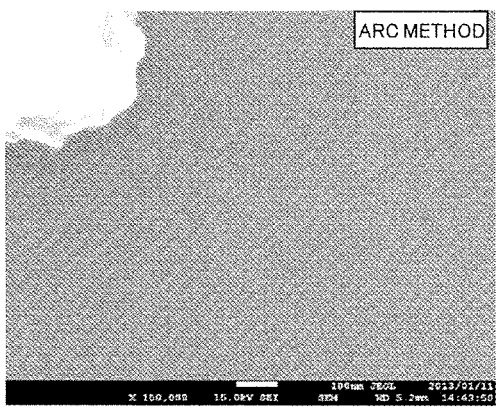
FIG. 13A illustrates an SEM photograph of the comparative sample observed using a scanning electron microscope.
Figure 13B:
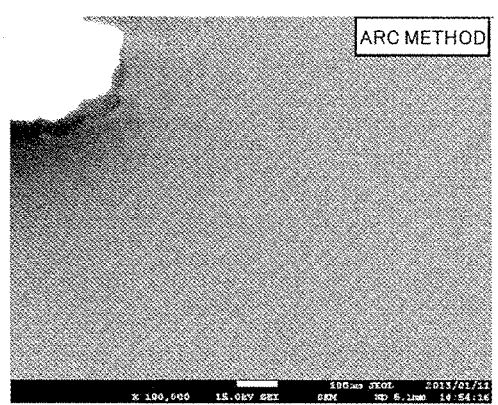
FIG. 13B illustrates an SEM photograph of the comparative sample observed using a scanning electron microscope.
Figure 13C:
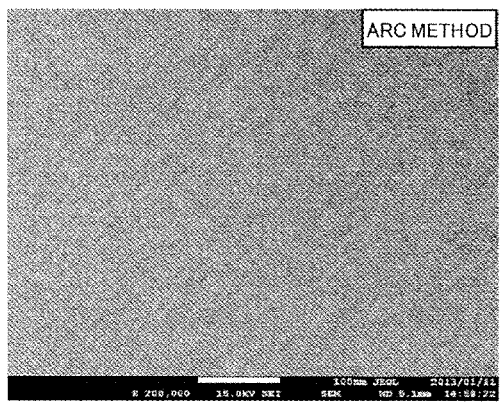
FIG. 13C illustrates an SEM photograph of the comparative sample observed using a scanning electron microscope.
Figure 13D:
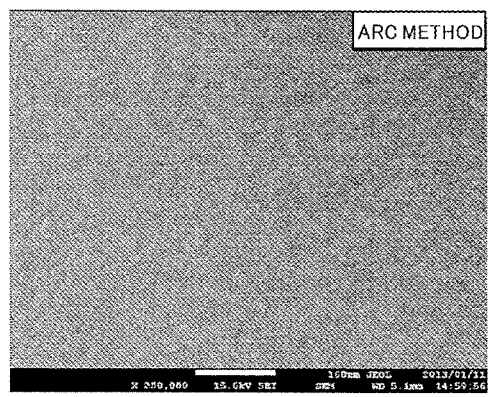
FIG. 13D illustrates an SEM photograph of the comparative sample observed using a scanning electron microscope.

In FIGS. 9B, 10B, and 11B, lattice fringes that reflect the presence of carbon crystals are observed. This indicates that the carbon particles included in the example sample had crystallinity.

Since the carbon particles were electrically connected due to a tunneling effect (see FIGS. 8A and 8B illustrating the example sample observed using the scanning electron microscope), and had crystallinity (see FIGS. 9A to 11B illustrating the example sample observed using the transmission electron microscope), it is considered that the carbon particles included in the example sample had a graphene structure.

As illustrated in FIGS. 13A to 13D, particles were not observed in the comparative sample prepared using the arc discharge method. The comparative sample were colored in brown, and the thickness of the deposited film was about 10 nm. Therefore, it is considered that the comparative sample was amorphous. An amorphous carbon film has an electric conductivity significantly lower than that of a carbon film having a graphene structure. When using the arc discharge method, it is necessary to form a film having a certain thickness in order to prevent a charging phenomenon when using a scanning electron microscope or the like.

Figure 14A:
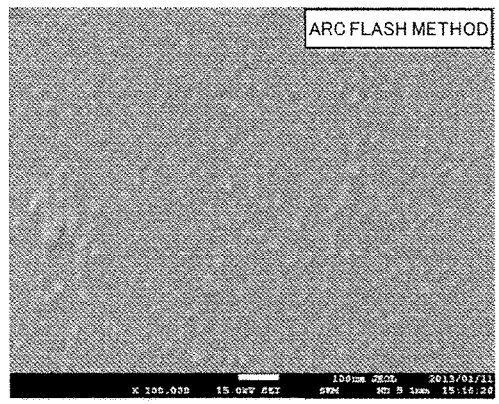
FIG. 14A illustrates an SEM photograph of the comparative sample observed using a scanning electron microscope.
Figure 14B:
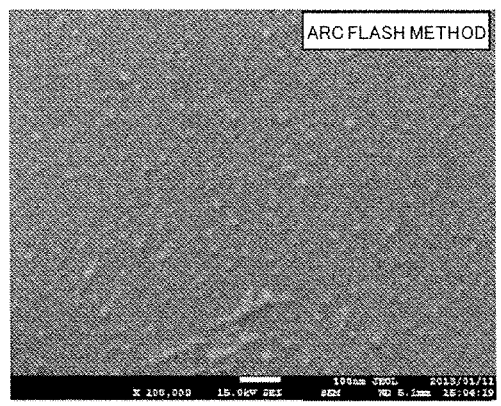
FIG. 14B illustrates an SEM photograph of the comparative sample observed using a scanning electron microscope.
Figure 14C:
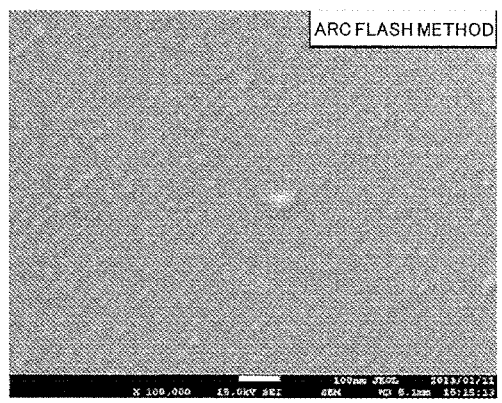
FIG. 14C illustrates an SEM photograph of the comparative sample observed using a scanning electron microscope.
Figure 14D:
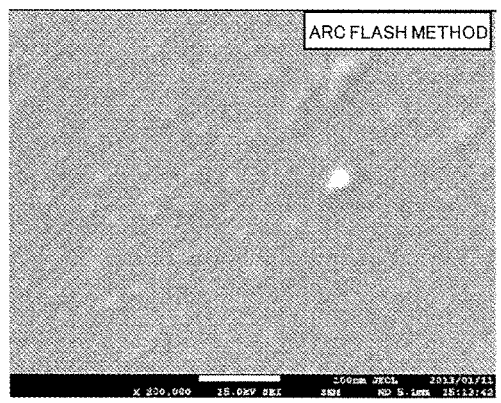
FIG. 14D illustrates an SEM photograph of the comparative sample observed using a scanning electron microscope.

As illustrated in FIGS. 14A to 14D, carbon particles having a particle size of about 30 to 50 nm were observed in the comparative sample prepared using the arc flash method. However, aggregation of the carbon particles was observed. The SEM photograph (magnification: 200,000) illustrated in FIG. 14D is unclear due to a charging phenomenon. This indicates that the carbon particles prepared using the arc flash method had insufficient electric conductivity.

It was thus confirmed that the deposition device according to the embodiments of the invention makes it possible to deposit the material particles without causing aggregation.

The invention includes configurations that are substantially the same as the configurations described in connection with the above embodiments (e.g., in function, method and effect, or objective and effect). The invention also includes a configuration in which an unsubstantial element among the elements described in connection with the above embodiments is replaced by another element. The invention also includes a configuration having the same effects as those of the configurations described in connection with the above embodiments, or a configuration capable of achieving the same object as those of the configurations described in connection with the above embodiments. The invention further includes a configuration obtained by adding a known technique to the configurations described in connection with the above embodiments.

The invention claimed is:

1. A deposition device that deposits material particles, the deposition device comprising:
    a holding stage that holds a raw material for generating the material particles;
    an ionization section that ionizes the material particles utilizing a photoelectric effect in a reaction chamber to which the material particles are supplied; and
    an electrode section that guides the ionized material particles to a given area utilizing a Coulomb force,
    wherein the electrode section includes an electron trap electrode for trapping electrons released from the material particles due to the photoelectric effect, and a material particle trap electrode for trapping the ionized material particles;
    wherein the electron trap electrode has a cylindrical shape surrounding the holding stage, and the electron trap electrode produces the Coulomb force that guides the ionized material particles to the material particle trap electrode;
    wherein the electron trap electrode and the ionized material particles have the same polarity; and
    wherein the ionization section is configured to ionize the material particles by applying electromagnetic waves to the inside of the electron trap electrode having the cylindrical shape, the electromagnetic waves having an energy that is higher than a work function of the material particles.

2. The deposition device according to claim 1, further comprising:
    a material particle supply section that supplies the material particles to the reaction chamber.

3. The deposition device according to claim 2,
    wherein the material particle supply section includes a first electrode and a second electrode, and causes an electric discharge to occur between the first electrode and the second electrode to supply the material particles.

4. The deposition device according to claim 2,
    wherein the material particle supply section vaporizes a raw material by applying electromagnetic waves to supply the material particles.

5. The deposition device according to claim 2,
    wherein the material particle supply section supplies fluid that includes the material particles.

6. The deposition device according to claim 1, further comprising:
    a temperature control section that controls a temperature of the material particles.

7. The deposition device according to claim 1, further comprising:
    a magnetic field generation section that generates a magnetic field in a travel path of the ionized material particles.

8. The deposition device according to claim 1, further comprising:
    a mass filter section that sorts the ionized material particles corresponding to mass.

9. The deposition device according to claim 1, further comprising:
    a valve that is disposed between the reaction chamber and a sample chamber, the ionized material particles being deposited in the sample chamber.

10. The deposition device according to claim 1, further comprising:
    a neutralization section that supplies charged particles to the material particles deposited on the material particle trap electrode to neutralize the material particles deposited on the material particle trap electrode.

11. A deposition method that deposits material particles, the deposition method comprising:
    supplying the material particles to a reaction chamber;
    ionizing the material particles supplied to the reaction chamber utilizing a photoelectric effect; and
    guiding the ionized material particles to a given area utilizing a Coulomb force to deposit the material particles,
    wherein electrons released from the material particles due to the photoelectric effect are trapped by an electron trap electrode, and the ionized material particles are trapped by a material particle trap electrode;
    wherein the electron trap electrode has a cylindrical shape surrounding a holding stage that holds a raw material for generating the material particles, and the electron trap electrode produces the Coulomb force that guides the ionized material particles to the material particle trap electrode;
    wherein the electron trap electrode and the ionized material particles have the same polarity;
    wherein, in the ionization step, the material particles are ionized by applying electromagnetic waves to the inside of the electron trap electrode having the cylindrical shape, the electromagnetic waves having an energy that is higher than a work function of the material particles; and
    wherein, in the deposition step, a particle size of the material particles to be deposited is controlled by controlling a voltage to be applied between the electron trap electrode and the material particle trap electrode.

* * * * *